United States Patent
Rahimo et al.

(10) Patent No.: US 8,450,793 B2
(45) Date of Patent: May 28, 2013

(54) SEMICONDUCTOR MODULE

(75) Inventors: Munaf Rahimo, Uezwil (CH); Jan Vobecky, Lenzburg (CH); Wolfgang Janisch, Graenichen (CH); Arnost Kopta, Zurich (CH); Frank Ritchie, Aarau (CH)

(73) Assignee: ABB Technology AG, Zurich (CH)

( * ) Notice: Subject to any disclaimer, the term of this patent is extended or adjusted under 35 U.S.C. 154(b) by 252 days.

(21) Appl. No.: 12/753,570

(22) Filed: Apr. 2, 2010

(65) Prior Publication Data

US 2010/0244093 A1    Sep. 30, 2010

Related U.S. Application Data

(63) Continuation of application No. PCT/EP2008/063137, filed on Oct. 1, 2008.

(30) Foreign Application Priority Data

Oct. 3, 2007 (EP) .................................... 07117817

(51) Int. Cl.
*H01L 29/66* (2006.01)

(52) U.S. Cl.
USPC ............ 257/328; 257/E29.027; 257/E29.066; 257/E29.197; 257/E21.383; 257/142

(58) Field of Classification Search
USPC .................. 257/328, 142, E29.027, E29.066, 257/E29.197, E21.383
See application file for complete search history.

(56) References Cited

U.S. PATENT DOCUMENTS 6,482,681 B1    11/2002 Francis et al.
6,683,343 B2 *  1/2004 Matsudai et al. ............. 257/328

(Continued)

FOREIGN PATENT DOCUMENTS

DE    198 29 614 A1    1/2000
EP    0 969 501 A    1/2000

(Continued)

OTHER PUBLICATIONS

International Search Report (PCT/ISA/210) for PCT/EP2008/063137 dated Dec. 5, 2008.

(Continued)

*Primary Examiner* — Jarrett Stark
(74) *Attorney, Agent, or Firm* — Buchanan Ingersoll & Rooney PC (57) ABSTRACT

A controlled-punch-through semiconductor device with a four-layer structure is disclosed which includes layers of different conductivity types, a collector on a collector side, and an emitter on an emitter side which lies opposite the collector side. The semiconductor device can be produced by a method performed in the following order: producing layers on the emitter side of wafer of a first conductivity type; thinning the wafer on a second side; applying particles of the first conductivity type to the wafer on the collector side for forming a first buffer layer having a first peak doping concentration in a first depth, which is higher than doping of the wafer; applying particles of a second conductivity type to the wafer on the second side for forming a collector layer on the collector side; and forming a collector metallization on the second side. At any stage particles of the first conductivity type can be applied to the wafer on the second side for forming a second buffer layer with a second peak doping concentration lower than the first peak doping concentration of the first buffer layer, but higher than the doping of the wafer. A third buffer layer can be arranged between the first depth and the second depth with a doping concentration which is lower than the second peak doping concentration of the second buffer layer. Thermal treatment can be used for forming the first buffer layer, the second buffer layer and/or the collector layer.

8 Claims, 4 Drawing Sheets

U.S. PATENT DOCUMENTS

| | | | |
|---|---|---|---|
| 6,707,111 B2* | 3/2004 | Francis et al. | 257/362 |
| 6,717,188 B2* | 4/2004 | Aoki | 257/191 |
| 6,987,320 B2* | 1/2006 | Miyachi et al. | 257/746 |
| 7,635,878 B2* | 12/2009 | Suekawa | 257/197 |
| 7,759,733 B2* | 7/2010 | Ono et al. | 257/341 |
| 2002/0079534 A1* | 6/2002 | Kang et al. | 257/327 |
| 2002/0117712 A1 | 8/2002 | Matsudai et al. | |
| 2002/0185656 A1* | 12/2002 | Aoki | 257/197 |
| 2004/0066610 A1* | 4/2004 | Miyachi et al. | 361/679 |
| 2004/0080015 A1 | 4/2004 | Mauder et al. | |
| 2007/0120170 A1* | 5/2007 | Niedernostheide et al. | 257/302 |
| 2007/0272953 A1* | 11/2007 | Hirler | 257/285 |
| 2008/0006856 A1* | 1/2008 | Kobayashi et al. | 257/288 |
| 2008/0246084 A1* | 10/2008 | Ono et al. | 257/341 |
| 2008/0315364 A1* | 12/2008 | Nemoto | 257/617 |
| 2009/0014754 A1* | 1/2009 | Yoshikawa | 257/139 |
| 2009/0184338 A1* | 7/2009 | Hisamoto | 257/139 |
| 2009/0283863 A1* | 11/2009 | Suekawa | 257/577 |
| 2010/0240171 A1* | 9/2010 | Stan et al. | 438/87 |

FOREIGN PATENT DOCUMENTS

| | | |
|---|---|---|
| EP | 1 237 200 A2 | 9/2002 |
| JP | 2004-193212 A | 7/2004 |

OTHER PUBLICATIONS

Written Opinion (PCT/ISA/237) for PCT/EP2008/063137 dated Dec. 5, 2008.

European Search Report for EP 07117817.2 dated May 8, 2008.

\* cited by examiner

SEMICONDUCTOR MODULE

RELATED APPLICATIONS

This application claims priority as a continuation application under 35 U.S.C. §120 to PCT/EP2008/063137, which was filed as an International Application on Oct. 1, 2008 designating the U.S., and which claims priority to European Application 07117817.2 filed in Europe on Oct. 3, 2007. The entire contents of these applications are hereby incorporated by reference in their entireties.

FIELD

The disclosure relates to the field of power electronics, such as to methods for producing a controlled punch-through semiconductor device.

BACKGROUND INFORMATION

Figure 1:
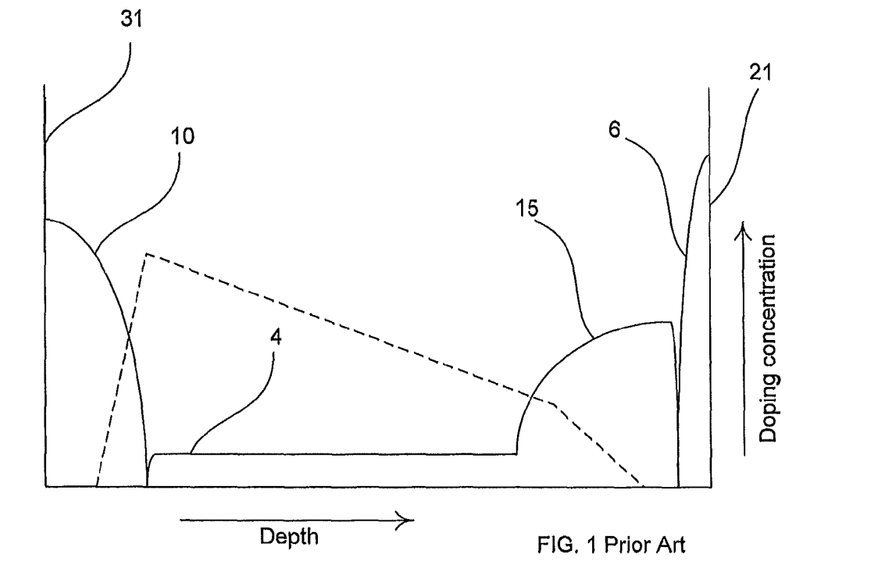
FIG. 1 shows a doping profile of a semiconductor module for a known punch-through semiconductor device.
Figure 2:
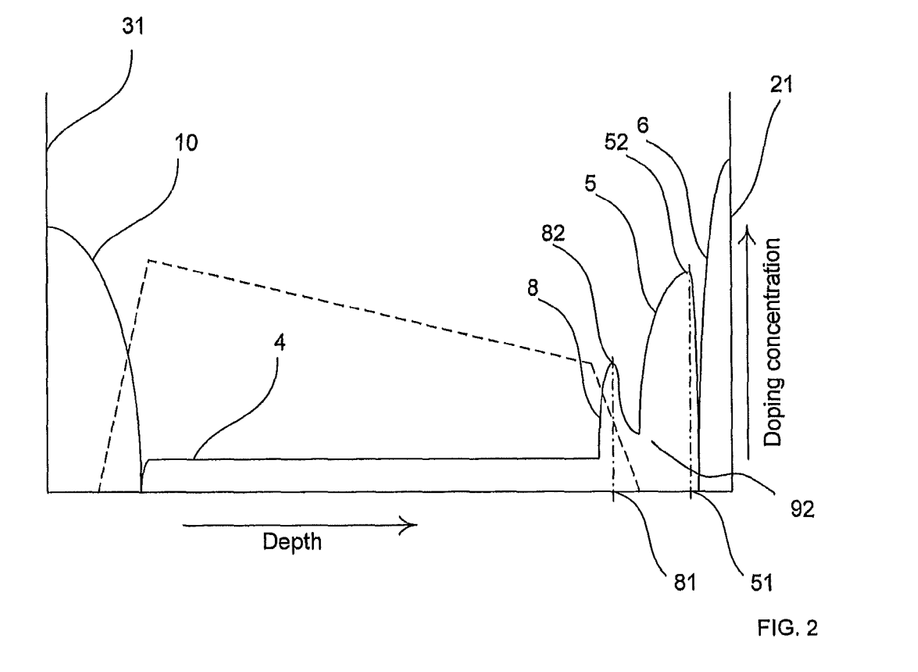
FIG. 2 shows a doping profile of a semiconductor module for a semiconductor device according to an exemplary embodiment disclosed herein.

In U.S. Pat. No. 6,482,681 B1 a punch-through (PT) insulated gate bipolar transistor (IGBT) is described. Such a PT-IGBT is also schematically shown in FIG. 1. The FIG. 1 device can be produced by using an n doped wafer, on top of which processes for manufacturing layers on the emitter side 31, also called cathode side, are finished (i.e., all junctions and metallizations on the emitter side 31 are produced). Afterwards, the wafer is thinned and hydrogen ions are implanted on the collector side 21 of the wafer, also called anode side for forming an n+ doped buffer layer 15. Then p type particles are implanted for forming a collector layer 6. The wafer is then annealed at 300 to 400° C. in order to activate the hydrogen ions without damage to the structure on the emitter side 31. The buffer layer 15 can also be formed by multiple hydrogen implants of progressively shallower and progressively higher total dose in order to form one buffer layer 15 with increasing doping concentration towards the collector and a peak dose concentration close to the collector.

Due to the continuously rising doping concentration in the buffer layer 15 the reduction of the electric field during operation of the device increases within the layer. Thus, the buffer layer 15 serves, in the blocking case, for abruptly decelerating the electric field (shown in FIG. 1 by the dotted line) before the collector, thus keeping it away from the collector. The semiconductor element can be destroyed if the electric field reaches the collector.

DE 198 29 614 discloses a fabrication method for a soft punch-through power semiconductor element based on a PT type. Relatively thin semiconductor elements can be fabricated without having to employ an epitaxy method. For this purpose, a buffer layer having a greater thickness than electrically necessary is introduced into a lightly doped wafer. Process steps for embodying a cathode patterned surface of the semiconductor element are then carried out. Afterward, the thickness of the buffer layer is reduced to the electrically desired size by grinding or polishing. Thus, the cathode process steps can be performed on a relatively thick wafer, thereby reducing the risk of breaking. Nevertheless, by virtue of the subsequent thinning of the wafer, a semiconductor element having a desired small thickness can be produced. The minimum thickness of the finished semiconductor elements is not limited by a minimum thickness that can be achieved for its starting material. In addition, doping of the residual stop layer can be relatively low, so that the emitter efficiency can be set by way of the doping of the collector.

JP 2004 193212 relates to a PT-IGBT with two buffer layers which are separated by a layer which has the same doping density as the base layer. The deeper buffer layer has a lower peak doping concentration than the shallow buffer layer. Such a device has a high leakage current and a low breakthrough voltage.

All of the documents mentioned herein are incorporated by reference in their entireties.

SUMMARY

A method is disclosed for producing a controlled-punch-through semiconductor device having a four-layer structure with layers of different conductivity types, and having a collector on a collector side and an emitter on an emitter side which lies opposite the collector side, the method comprising: producing layers on the emitter side of a wafer of a first conductivity type; thinning the wafer on a second side opposite the emitter side subsequent to the producing of layers; applying particles of the first conductivity type to the wafer on the second side, which particles form a first buffer layer in the semiconductor device, the first buffer layer having a first peak doping concentration in a first depth, which first peak doping concentration is higher than a doping of the wafer; applying particles of a second conductivity type to the wafer on the second side, which particles form a collector layer on the collector side of the semiconductor device; forming a collector metallization on the second side after applying the particles of the first and second conductivity types; applying, at any stage of the method, particles of the first conductivity type to the wafer on the second side by implantation of the particles, which particles form a second buffer layer in the semiconductor device, the second buffer layer having in a second depth, which second depth is greater than the first depth, a second peak doping concentration, which is lower than the first peak doping concentration of the first buffer layer and which is higher than the doping of the wafer, the first and second buffer layers being formed such that a third buffer layer is created between the second depth and the first depth with a doping concentration which is higher than the doping of the wafer and which is lower than the second peak doping concentration of the second buffer layer; and performing at least one wafer thermal treatment for forming at least one of the first buffer layer, the second buffer layer and the collector layer in the semiconductor device at any stage after applying the particles for at least one of the first buffer layer, the second buffer layer and the collector layer to the wafer.

A controlled-punch-through semiconductor device is also disclosed comprising: a four-layer structure having a collector on a collector side and an emitter on an emitter side which lies opposite the collector side; a base layer between the emitter and the collector; a first buffer layer, which lies on the collector side between the base layer and the collector, the first buffer layer having in a first depth a first peak doping concentration, which is higher than the base layer; a second buffer layer, which lies between the first buffer layer and the base layer, the second buffer layer having in a second depth a second peak doping concentration, which is lower than the first peak doping concentration of the first buffer layer; and a third buffer layer arranged between the second depth and the first depth with a doping concentration which is higher than the doping of the base layer and which is lower than the second peak doping concentration of the second buffer layer.

BRIEF DESCRIPTION OF THE DRAWINGS

The subject matter disclosed herein will be explained in more detail in the following discussion of exemplary embodiments when read with reference to the attached drawings, in which.

The reference symbols used in the figures and their meaning are summarized in the list of reference symbols. Generally, like or like-functioning parts are given the same reference symbols. The described embodiments are examples and do not limit the disclosure.

DETAILED DESCRIPTION

A method is disclosed for producing a soft controlled punch-through semiconductor device which can possess improved electrical properties, and which can be thin and easy to produce.

An exemplary controlled-punch-through semiconductor device is disclosed with a four-layer structure having layers of different conductivity types and having a collector on a collector side and an emitter on an emitter side, which lies opposite the collector side. Exemplary steps for producing the semiconductor device can be performed in the following order:

on a wafer of a first conductivity type having a first side, which is an emitter side in a finalized semiconductor device, and a second side lying opposite the first side, steps for producing layers on the emitter side of the semiconductor device are performed;

then the wafer is thinned on the second side;

then particles of a first conductivity type are applied to the wafer on its second side by implantation or deposition of the particles of the first conductivity type, which particles form a first buffer layer in the finalized semiconductor device, the first buffer layer having a first peak doping concentration in a first depth, which first peak doping concentration is higher than the doping of the wafer;

then particles of a second conductivity type are applied to the wafer on its second side by implantation or deposition, which particles form a collector layer in the finalized semiconductor device; and then an emitter metallization is formed on the second side.

At any stage, particles of the first conductivity type can be applied to the wafer on its second side by implantation of the particles, which particles form a second buffer layer in the finalized semiconductor device. The second buffer layer can have in a second depth a second peak doping concentration, which is lower than the first peak doping concentration of the first buffer layer and which is higher than the doping of the wafer.

Between the second depth of the second buffer layer and the first depth of the first buffer layer, a third buffer layer is created with a relatively low (e.g., minimum) doping concentration, which is higher than the doping of the wafer and lower than the second and first peak doping concentrations of the second and the first buffer layers. The minimum doping concentration of the third buffer layer can be defined as, for example, the point of the lowest doping concentration of the third buffer layer (i.e., the point of the lowest doping concentration between the first and the second buffer layer).

At any stage after applying the particles for the first buffer layer, the second buffer layer and/or the collector layer to the wafer, at least one wafer thermal treatment for forming the first buffer layer, the second buffer layer and/or the collector layer in the finalized semiconductor device can be performed.

In an exemplary semiconductor device, the electric field can be stopped in the second buffer layer. In the third buffer layer, the bipolar transistor current gain of the device, being defined, for example, as a ratio of the collector and base current, can be reduced. The first buffer layer further can reduce the bipolar current gain and make the device insensitive to variations of the depth of the second buffer layer. By having a device which is less sensitive to the position of the second buffer layer, manufacturing of such a device can be simplified and the switching properties and electrical properties of the device can be improved. Furthermore, by having a three buffer layer structure as disclosed herein, the buffer layers can be made thinner, resulting in much lower losses than in known devices.

Figure 4:
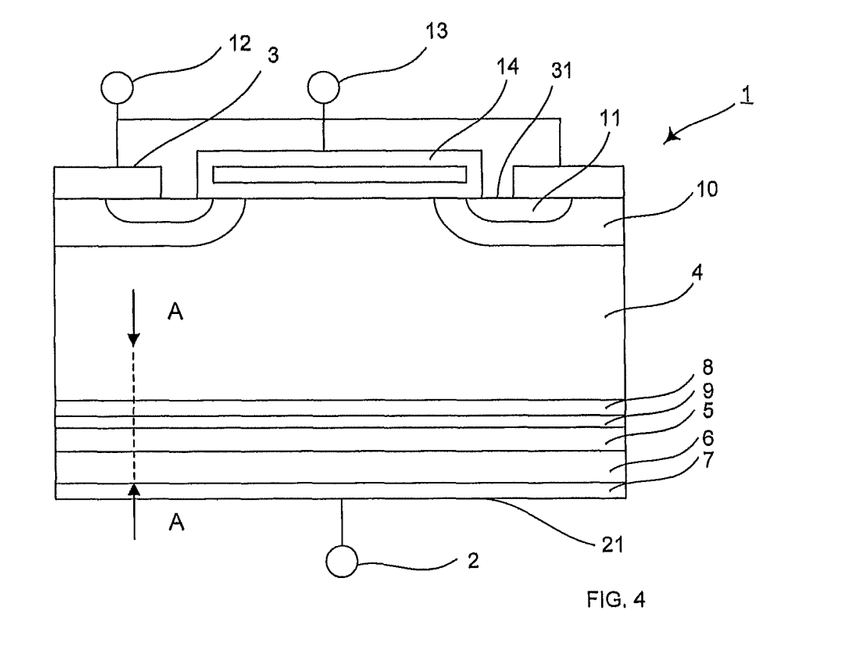
FIG. 4 shows a cross sectional view of a semiconductor module according to an exemplary embodiment disclosed herein.

FIG. 4 shows an exemplary semiconductor module disclosed herein as a controlled-punch-through semiconductor device 1 with a four-layer structure, such as an IGBT, having a collector 2 on a collector side 21 and an emitter 3 on an emitter side 31, which lies opposite the collector side 21. A base layer 4 is located between the emitter 3 and collector 2. A second buffer layer 8 lies on the collector side 21 between the base layer 4 and the collector 2. This buffer layer 8 has in a second depth 81 a second peak doping concentration 82, which is higher than the base layer 4. In the second buffer layer 8, an electric field is stopped during operation of the device 1.

Figure 3:
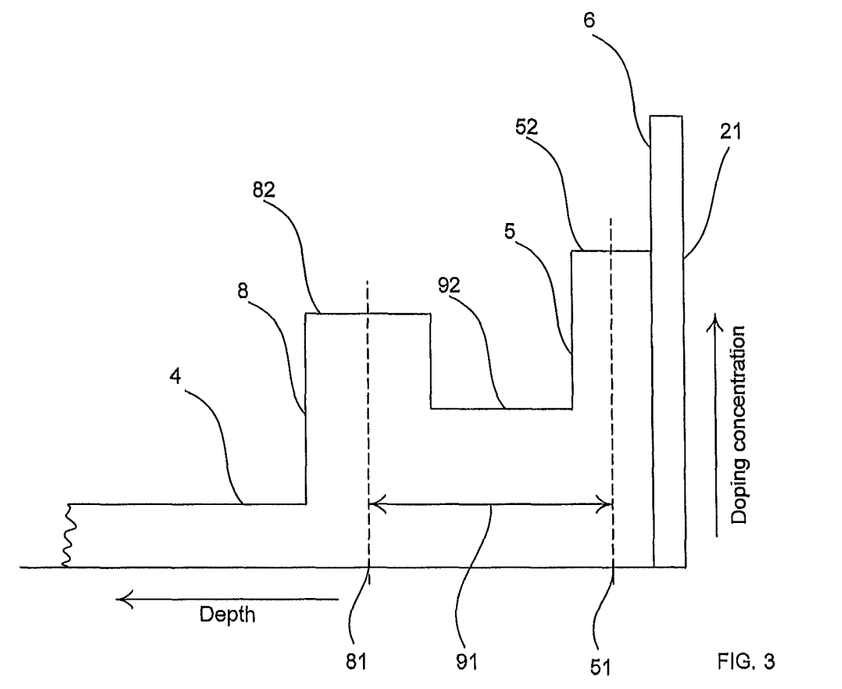
FIG. 3 shows a doping profile of FIG. 2 schematically in more detail.

A first buffer layer 5 lies between the second buffer layer 8 and the collector 2. As schematically shown in FIG. 3 this first buffer layer 5 has in a first depth 51, which depth is smaller than the second depth 81, a first peak doping concentration 52, which is higher than the second peak doping concentration 82 of the second buffer layer 8. The first and second buffer layers 5, 8 are formed in such a way that a third buffer layer 9 is formed between the second depth 81 and the first depth 51 with a doping concentration, which is lower than the first and second peak doping concentrations 51, 81 of the first and second buffer layers.

The third buffer layer 9 can have a minimum doping concentration 92, which is higher than the wafer doping, for example at least $1*10^{13}$ cm$^{-3}$ and in particular $2*10^{14}$ cm$^{-3}$, and preferably the minimum doping concentration 92 is in a range of, for example, $5*10^{14}$ cm$^{-3}$ up to $7*10^{14}$ cm$^{-3}$ (or lesser or greater). The first peak doping concentration 52 of the first buffer layer 5 lies in a first depth 51 between, for example, 0 to 2 μm, in particular 0.8 to 1.2 μm and preferably, for example, 0.9 to 1.1 μm. The second peak doping concentration 82 of the second buffer layer 8 lies in a second depth 81 between, for example, 3 to 10 μm, in particular, for example, 5 to 8 μm. The distance 91 between the second depth 81 and the first depth 51, the depths of the second and first peak doping concentrations 81, 51 of the second and first buffer layers is in a range, for example, between 1 μm and 10 μm and in particular, for example, 4 μm and 7 μm.

For producing an exemplary controlled-punch-through semiconductor device 1 as disclosed herein, steps for producing the semiconductor device can be performed in the following order:

on an (n-) doped wafer, which includes a first side, which is the emitter side 31 in the finalized semiconductor device 1, and a second side lying opposite the first side, steps for producing layers on the emitter side 31 of the semiconductor device 1 are performed. Such layers are, for example, a p doped channel region 10, which surrounds an n doped source region 11. These regions 10, 11 can be in electrical contact with an emitter electrode 12. A gate electrode 13 can be manufactured on top of the wafer, electrically insulated from the layers by an insulation layer 14. After performing such steps on the emitter side 31;

the wafer is thinned on its second side, which is the collector side 21 in the finalized semiconductor device 1; for example, it can be thinned to a minimum wafer thickness during manufacturing;

afterwards n type particles can be implanted or deposited on the wafer on its second side. These particles will form a first buffer layer 5 in the finalized semiconductor device 1. The first buffer layer 5 can have a first peak doping concentration 52 in a first depth 51, which first peak doping concentration 52 is higher than the doping of the wafer;

then p-type particles can be implanted or deposited on the wafer on the collector side 21, which particles form a collector layer 6 in the finalized semiconductor device 1; and then a collector metallization 7 can be formed on the second side.

at any stage, n type particles can be either implanted or deposited on the wafer on the collector side 21, which particles form a second buffer layer 8 in the finalized semiconductor device 1. The second buffer layer 8 has in a second depth 81, which depth is greater than the first depth 51, a second peak doping concentration 82, which is lower than the first peak doping concentration 52 of the first buffer layer 5 and which is higher than the doping of the wafer. The second buffer layer 8 can, for example, be arranged in such a depth 81 and includes such a doping that an electric field can be stopped during operation of the finalized semiconductor device. By introducing the second buffer layer 8 there is a third buffer layer 9 arranged between the second depth 81 of the second buffer layer 8 and the first depth 51 of the first buffer layer 5. This third buffer layer 9 can have a minimum doping concentration 92, which is lower than the first and second peak doping concentrations 51, 81 of the first and second buffer layers 5, 8.

at any stage after applying the particles for the first buffer layer 5, the second buffer layer 8 and/or the collector layer 6 to the wafer, at least one wafer thermal treatment for finalizing the first buffer layer 5, the second buffer layer 8 and/or the collector layer 6 can be performed.

The second peak doping concentration 82 of the second buffer layer 8 in the finalized semiconductor device 1 can lie in a second depth 81 between, for example, 3 to 10 µm and, for example, 5 to 8 µm. The distance 91 between the first depth 51 of the first peak doping concentration 52 of the first buffer layer 5 and the second depth 81 can be in a range between, for example, 1 µm and 10 µm and, for example, between 4 µm and 7 µm.

In an exemplary embodiment, the thermal treatment for any of the first buffer layer 5, second buffer layer 8 or collector layer 6 or for two or even all layers together can be performed at a temperature in a range between, for example, 350 up to 550° C. and, for example, between 400° C. up to 500° C. The thermal treatment can thus be done for one layer after the other, or the thermal treatment can be performed simultaneously for two or all layers.

The particles for forming the first buffer layer 5 are implanted at an energy in a range between, for example, 50 keV up to 600 keV. These particles can be applied in a dose range between, for example, $1*10^{12}$ cm$^{-2}$ up to $1*10^{16}$ cm$^{-2}$. For example, without limitation, phosphorous, arsenic or antimony can be used as particles for forming the first buffer layer 5. In another exemplary embodiment, the particles for forming the first buffer layer 5 can be driven into the wafer by the thermal treatment up to a depth of, for example, 0.5 up to 5 µm and/or the particles can have a maximum doping level of, for example, $5*10^{15}$ cm$^{-3}$ up to $1*10^{17}$ cm$^{-3}$, for example, $1*10^{16}$ cm$^{-3}$ up to $5*10^{16}$ cm$^{-3}$. The first peak doping concentration 52 of the first buffer layer 5 in the finalized semiconductor device lies in a first depth 51 between, for example, 0 to 2 µm, for example, 0.8 to 1.2 µm and preferably, for example, 0.9 to 1.1 µm.

In another exemplary embodiment, the particles for forming the first buffer layer 5 can be applied to the second side of the wafer by depositing an amorphous silicon layer. The silicon layer has a depth in a range between, for example, 0.5 µm up to 10 µm and/or a doping concentration above, for example, $1*10^{15}$ cm$^{-3}$.

In another exemplary embodiment, the particles for forming the collector layer 6 can be implanted with a maximum doping level of, for example, $1*10^{13}$ cm$^{-3}$ up to $1*10^{16}$ cm$^{-3}$. In an exemplary embodiment, boron particles can be used. These particles can be activated by a thermal treatment like low temperature activation or laser annealing.

Alternatively, the particles for forming the collector layer 6 can be applied to the second side of the wafer by depositing an amorphous silicon layer from a silicon source, which is pre-doped with boron. The silicon layer can have a depth in a range between, for example, 5 nm up to 1 µm and/or a doping concentration above $1*10^{15}$ cm$^{-3}$. Using the method of depositing the layer 6 can have an advantage that the particles do not penetrate into the region, in which the particles for the first buffer layer 5 are, so that the full thickness of the first buffer layer 5 can be maintained.

In a further exemplary embodiment, the particles for forming the second buffer layer 8 are protons, which are implanted, in a dose range between, for example, $1*10^{12}$ cm$^{-2}$ up to $1*10^{15}$ cm$^{-2}$ and/or an energy in a range between, for example, 200 keV up to 1000 keV. The particles for forming the second buffer layer 8 can be driven into the wafer by the thermal treatment up to a depth of, for example, 2 up to 15 µm, for example, 2 µm up to 8 µm and preferably 2 µm up to 5 µm. The particles can have an exemplary maximum doping level of, for example, $1*10^{15}$ cm$^{-3}$ up to $5*10^{16}$ cm$^{-3}$ and, for example, $5*10^{15}$ cm$^{-3}$ up to $5*10^{16}$ cm$^{-3}$. In exemplary embodiments, helium, deuterium, phosphorous, arsenic or antimony can be used as particles for forming the second buffer layer 8. The particles can be implanted at an energy of more than, for example, 1 MeV. Phosphorous can be used, because phosphorous has a comparably small particle size so that the particles can deeply penetrate into the wafer. Furthermore, it is possible to have phosphorous not only single charged, but double, triple or even more heavily charged, which makes it possible to achieve deeper lying layers. There are also no special precautions necessary when applying phosphorous to the wafer. As both first and second buffer layer 5, 8 can be made with phosphorous only one kind of particle material is needed, thus simplifying the manufacturing of the device.

Figure 8:
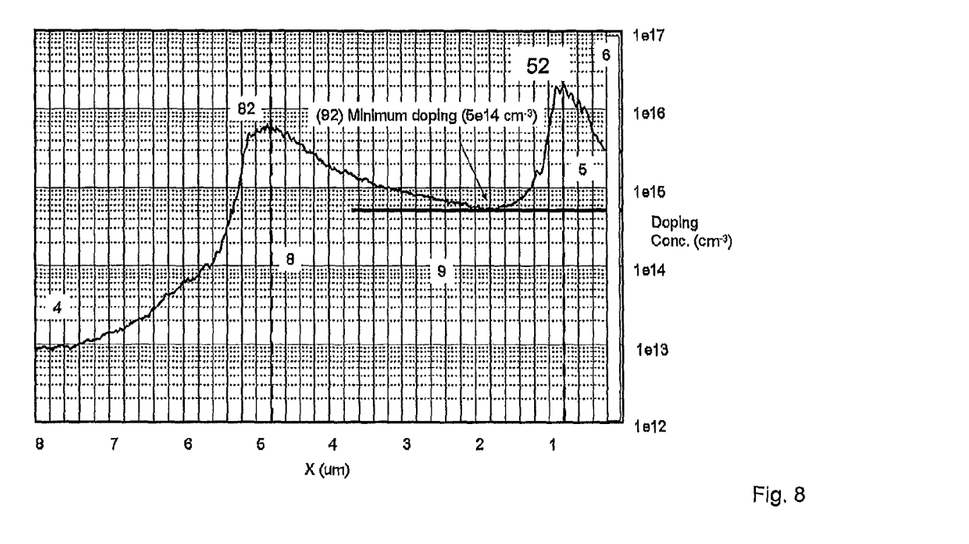

FIG. 8 shows an exemplary doping concentration of the base layer 4 and the buffer layers 8, 9, 5 through a cut along the line A-A in FIG. 4. The minimum value for the doping concentration 92 of the third buffer layer 9 in FIG. 8 is obtained by the implantation of n-type species for the first and second buffer layers 8 and 5 followed by a low temperature thermal anneal (300-550)° C. The lowest doping concentration point 92 in the third buffer layer 9 of, for example, $5*10^{14}$ cm$^{-3}$ is achieved due to the overlapping of the n-type dopings of the first and second buffer layers 8 and 5 as shown in FIG. 8.

Figure 5:
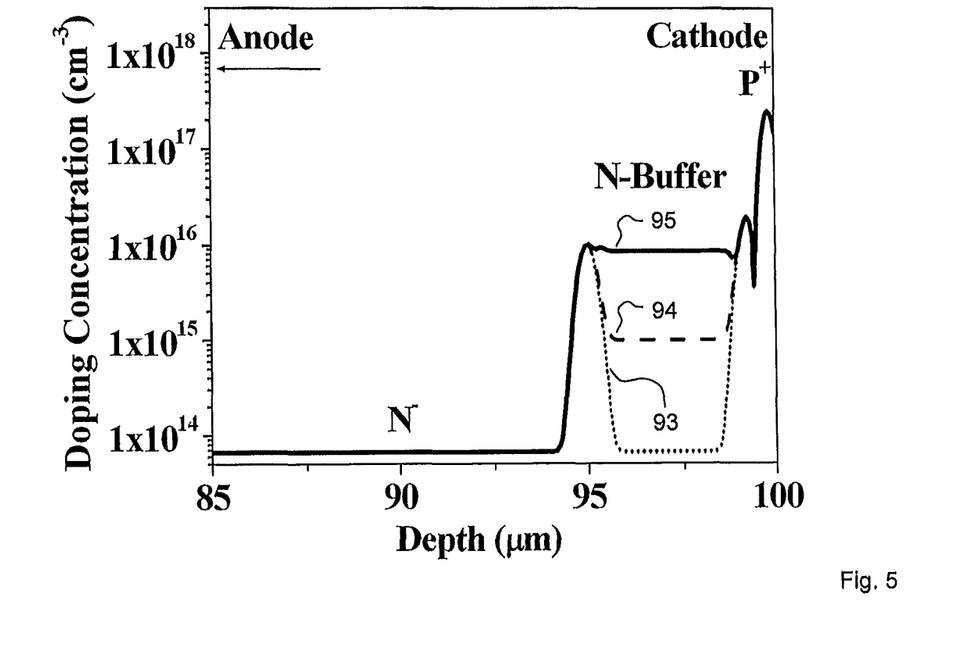

FIG. 5 shows in comparison semiconductor devices with a first buffer and a second buffer. In the figure there is shown the influence of the minimum doping concentration of the third buffer layer. The dotted line 93 shows the case of a semiconductor device which has no third buffer layer (e.g., in case where there is a layer between the first and second buffer layer which has the same dose concentration as the base layer 4 or wafer, respectively as is known, for example, from JP 2004 193212). The continuous line 95 shows the case of a semiconductor device, in which there is no drop in doping concentration between the first buffer layer 5 and the peak of the second buffer layer 82. The dashed line 94 shows the case on a semiconductor device as disclosed herein, in which the third buffer layer 9 has a minimum doping concentration 92, which is higher than the doping of the base layer 4 and lower than the second peak doping concentration 82 of the second buffer layer.

Figure 6:
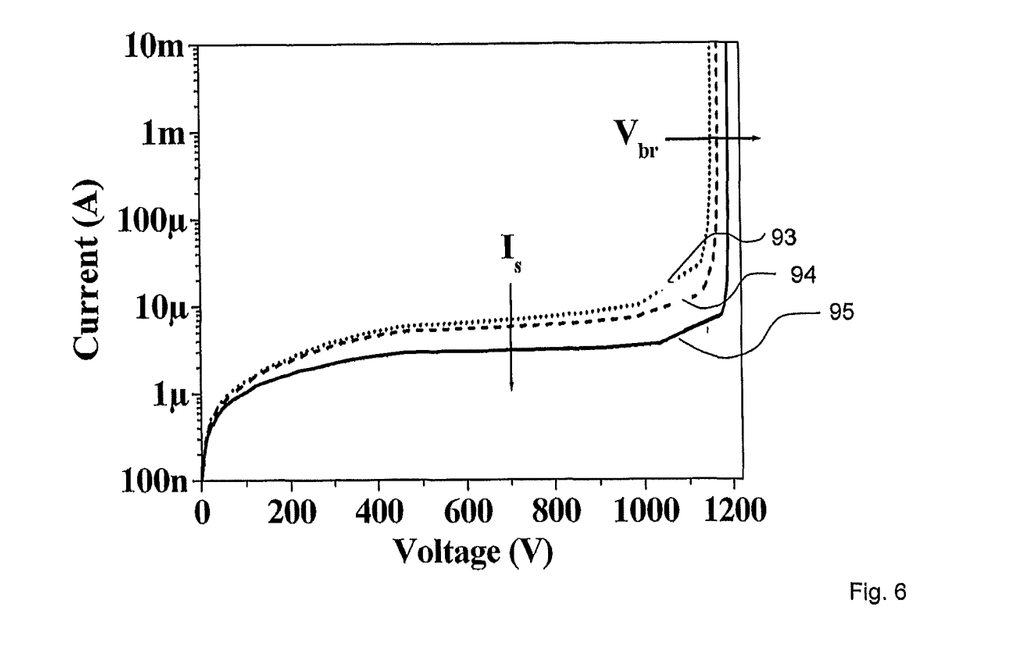
Figure 7:
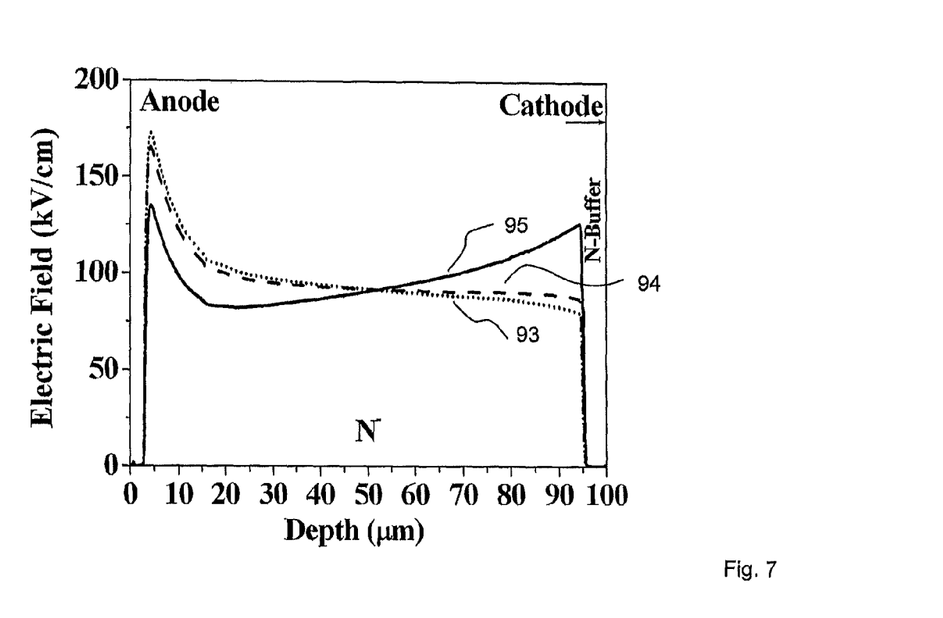

FIG. 6 shows a graphic of voltage versus current of an exemplary device. The current $I_s$ is the leakage current and $V_{br}$ is the breakthrough voltage. In FIG. 7, an exemplary short circuit behaviour of the devices is shown for a line voltage of 900 V and a gate emitter voltage $V_{ge}$=20 V at room temperature (300 K).

The device, in which the layer between the first and second buffer layer has the same doping concentration as the base layer 4 (dotted line 93), can have a good short circuit behaviour (see FIG. 7), but can have a high leakage current of, for example, 8.8 A and a low breakdown voltage of 1152 V.

For the exemplary device, without a drop in doping concentration between the first buffer layer 5 and the peak of the second buffer layer 82 (continuous line 95; the peak dose concentration 82 of the second buffer layer and therefore, in this case also the minimum doping concentration of the third buffer layer 9 being $1*10^{16}$ cm$^{-3}$) the leakage current is low (3.2 A) and the breakthrough voltage is higher (1200 V). However, as shown in FIG. 7, for such a device the electrical field can be close to flip from the anode to the cathode, especially if the gate emitter voltage is slightly increased resulting in a failure of the device.

An exemplary semiconductor device with a third, intermediate buffer layer 9, can have good short circuit behaviour (i.e., the electric field as shown in FIG. 7 can be kept low, while the leakage current (6.7 V) is also low and the breakdown voltage is enhanced (1162 V) compared to the device with no intermediate buffer layer (FIG. 6)).

In the preceding description n doped layers have been used as an example of a layers of a first conductivity type and p doped layers as an example for layers of a second conductivity type, but the layers can also be of the opposite conductivity type.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST 1 semiconductor device
2 collector
21 collector side
3 emitter
31 emitter side
4 base layer
5 first buffer layer
51 first depth
52 first peak doping concentration
6 collector layer
7 collector metallization
8 second buffer layer
81 second depth
82 second peak doping concentration
9 third buffer layer
91 distance
92 minimum doping concentration
10 channel region
11 source region
12 emitter electrode
13 gate electrode
14 insulation layer
15 buffer layer

What is claimed is:

1. A controlled-punch-through semiconductor device comprising:
   a four-layer structure having a collector on a collector side and an emitter on an emitter side which lies opposite the collector side;
   a base layer between the emitter and the collector;
   a first buffer layer, which lies on the collector side between the base layer and the collector, the first buffer layer having in a first depth from the collector a first peak doping concentration, which is higher than the base layer;
   a second buffer layer, which lies between the first buffer layer and the base layer, the second buffer layer having in a second depth from the collector a second peak doping concentration which is lower than the first peak doping concentration of the first buffer layer; and
   a third buffer layer arranged between the second depth and the first depth with a doping concentration which is higher than the doping of the base layer and which is lower than the second peak doping concentration of the second buffer layer.

2. Semiconductor device according to claim 1, wherein the third buffer layer has a minimum doping concentration of at least 5*1014 cm−3.

3. Semiconductor device according to claim 1, wherein the first peak doping concentration of the first buffer layer lies in a first depth between 0 to 2 µm from the collector, and /or the second peak doping concentration of the second buffer layer lies in a second depth between 3 to 10 µm from the collector and/or the distance between the first and second depth is in a range between 1 µm and 10 µm.

4. Semiconductor device according to claim 1, wherein the third buffer layer has a minimum doping concentration of at least 7*1014 cm−3.

5. Semiconductor device according to claim 1, wherein the third buffer layer has a minimum doping concentration of at least 1*1015 cm−3.

6. Semiconductor device according to claim 3, wherein the first peak doping concentration of the first buffer layer lies in the first depth between 0.8 to 1.2 µm from the collector.

7. Semiconductor device according to claim 1, wherein the first peak doping concentration of the first buffer layer lies in a first depth between 0.9 to 1.1 µm from the collector, and/or the second peak doping concentration of the second buffer layer lies in a second depth between 5 to 8 µm from the collector and/or the distance between the first and second depth is in a range between 4 μm and 7 μm.

8. Semiconductor device according to claim 1, wherein the first, second and third buffer layers are of a first conductivity type.

* * * * *